(12) United States Patent
Grossniklaus et al.

(10) Patent No.: US 7,394,642 B2
(45) Date of Patent: Jul. 1, 2008

(54) TUBULAR CAPACITOR WITH VARIABLE CAPACITANCE AND DIELECTRICALLY ELONGATED INNER ELECTRODE FOR NMR APPLICATIONS

(75) Inventors: Beat Grossniklaus, Riedt (CH); Daniel Marek, Moeriken (CH); Roberto Seydoux, Uster (CH); Oskar Schett, Uster (CH)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 11/509,781

(22) Filed: Aug. 25, 2006

(65) Prior Publication Data
US 2007/0070578 A1    Mar. 29, 2007

(30) Foreign Application Priority Data
Sep. 27, 2005    (DE) .................. 10 2005 046 039

(51) Int. Cl.
*H01G 5/04*    (2006.01)
*H01G 4/06*    (2006.01)
(52) U.S. Cl. .................................... 361/292; 361/321.6
(58) Field of Classification Search ......... 361/277–278, 361/292, 294–295, 321.6
See application file for complete search history.

(56) References Cited

U.S. PATENT DOCUMENTS

| | | | |
|---|---|---|---|
| 3,329,875 A * | 7/1967 | Demeritt ................. | 361/295 |
| 3,360,700 A * | 12/1967 | Ainley .................... | 361/295 |
| 3,361,945 A * | 1/1968 | Mittler et al. ............ | 361/295 |
| 3,731,165 A | 5/1973 | Solow | |
| 3,938,012 A * | 2/1976 | Patti ....................... | 361/295 |
| 4,389,762 A * | 6/1983 | Reeves ................... | 29/25.42 |
| 5,856,769 A * | 1/1999 | Kiser ...................... | 333/174 |
| 2003/0137300 A1 | 7/2003 | Gonella | |
| 2005/0168223 A1* | 8/2005 | Zeiger et al. ............ | 324/322 |

FOREIGN PATENT DOCUMENTS

DE           1 108 809        10/1963

OTHER PUBLICATIONS

"Avance—The Pulse Of Innovation", Bruker BioSpin AG, Faellanden, Switzerland Apr. 2004.

* cited by examiner

*Primary Examiner*—Eric Thomas
(74) *Attorney, Agent, or Firm*—Paul Vincent

(57) ABSTRACT

A tubular capacitor with variable capacitance, including a cylindrical tube (3) of dielectric material, a metallic outer electrode (1) which surrounds the cylindrical tube (3), and an inner electrode which can axially move in the inner bore (41) of the cylindrical tube (3) and which abuts the inner bore (41), wherein the inner electrode includes a metallic rod (2; 2a; 2b; 2c), is characterized in that the metallic rod (2; 2a; 2b; 2c) is axially extended at its end (5'), located in the inner bore (41) of the cylindrical tube (3), using a rod (9; 9a; 9b; 9c) of dielectric material. The inventive tubular capacitor has an increased dielectric strength and improves the resolution of NMR spectrometers.

13 Claims, 10 Drawing Sheets

TUBULAR CAPACITOR WITH VARIABLE CAPACITANCE AND DIELECTRICALLY ELONGATED INNER ELECTRODE FOR NMR APPLICATIONS

This application claims Paris Convention priority of DE 10 2005 046 039.9 filed Sep. 27, 2005 the complete disclosure of which is hereby incorporated by reference.

BACKGROUND OF THE INVENTION

The invention concerns a tubular capacitor with variable capacitance comprising a cylindrical tube of dielectric material, a metallic outer electrode which surrounds the cylindrical tube, and an inner electrode which can axially move in the inner bore of the cylindrical tube and which abuts the inner bore, the inner electrode comprising a metallic rod.

Tubular capacitors of this type are e.g. used in NMR spectroscopic systems as described in the company leaflet "Avance—The Pulse Of Innovation" by the company Bruker BioSpin AG, Fällanden, Switzerland, April 2004.

Nuclear magnetic resonance (NMR) spectrometry is one of the most powerful methods of instrumental analytics and is used, in particular, in biological sciences and material research. A radio frequency (RF) resonator thereby irradiates RF field pulses into a sample and the response of the sample is measured and evaluated.

Irradiation of RF field pulses of minimum length yields NMR spectra of high quality. The minimum achievable length depends on the maximum value of the RF field amplitude that can be set without generating high voltage sparkovers in the RF resonator and, in particular, also in the capacitive tuning elements of the RF resonator. For this reason, the high voltage resistance (or dielectric strength) of the capacitive tuning elements limits the quality of the resulting NMR spectra. Conventional capacitive tuning elements are tubular capacitors with variable capacitance, as described above.

It is therefore the underlying purpose of the present invention to increase the dielectric strength of tubular capacitors with variable capacitance and, in particular, to improve the resolution of NMR spectrometers using these tubular capacitors.

SUMMARY OF THE INVENTION

This object is achieved by a tubular capacitor of the above-mentioned type which is characterized in that the end of the metallic rod, that is located in the inner bore of the cylindrical tube, is extended in an axial direction by a rod made from a dielectric material.

The present invention has shown that, in a conventional tubular capacitor, high voltage sparkovers do not occur in the region of the narrow gap between the cylindrical tube of dielectric material and the abutting metallic rod of the inner electrode, rather in the region of the end of the metallic rod. The high voltage sparkover surprisingly occurs at a location where the electrodes have a relatively large separation from each other, with intermediate air. This also applies when the metallic rod has a rounded end part.

The dielectric strength of the inventive tubular capacitor is increased in that, in the region of the tubular capacitor with increased risk of high voltage sparkovers, the air having little dielectric strength is replaced by a rigid, electrically insulating, dielectric material which has a much higher dielectric strength than air or other gases (factor 10 or more compared to air). Mounting a rod of dielectric material to the end of the metallic rod which is susceptible to breakdown always correctly positions the dielectric material. The dielectric rod material may e.g. be plastic material, in particular Teflon, glass or also ceramic materials, in particular, aluminum oxide.

In one preferred embodiment of the inventive tubular capacitor, the rod of dielectric material has the same outer diameter as the metallic rod in the region where it is connected to the metallic rod. The outer diameter of the rod of dielectric material need not be constant over its entire length. The outer diameter of the rods should, however, be identical on the outer side of the rods at the annular transition line between the metallic rod and the rod of dielectric material. This yields high dielectric strength. The rods and the bore preferably have a circular or elliptical cross-section. For non-circular (in particular cornered) cross-sections, the outer contours of the cross-section of a rod replaces the outer diameter.

In a preferred further development of this embodiment, the rod of dielectric material has the same outer diameter as the metallic rod in a longitudinal region directly following the metallic rod and preferably along its entire length. This directly joining longitudinal region preferably corresponds to at least 1.5 times the diameter of the metallic rod plus the axial extension of an end part of the metallic rod that is generally used. This also ensures high dielectric strength of the tubular capacitor by avoiding large air gaps in the vicinity of the end of the metallic rod.

In one particularly preferred embodiment of the inventive tubular capacitor, the end of the metallic rod that is located in the inner bore of the cylindrical tube has a rounded end part, which preferably avoids sharp transitions at this end of the metallic rod. The end part of the metallic rod starts where the shape of the metallic rod end region, located in the bore of the dielectric tube, differs from the cylindrical shape, i.e. where the diameter is reduced. The rounded end part and the metallic rod are regularly formed in one piece. The rounded end part reduces the field strength in the surroundings of the end of the metallic rod, thereby reducing the tendency for high voltage sparkovers.

In a preferred further development of this embodiment, the length $L_D$ of the rod of dielectric material is at least the sum of the axial extension $L_A$ of the end part and 1.5 times the diameter $D_M$ of the metallic rod. This means $L_D \geq L_A + 1.5 D_M$. The rod of dielectric material thereby covers the region at the end of the metallic rod, which is particularly susceptible to sparkovers, thereby improving the dielectric strength.

In one preferred further development, the end part of the metallic rod has at least one cylindrical step. A cylindrical step is a length section (or plateau region) of the end part, where the outer diameter is constant over a non-vanishing length (but is smaller than the diameter of the metallic rod in its cylindrical region remote from the end part). The dielectric extension (i.e. the rod of dielectric material) can thereby be connected to the metallic rod with improved mechanical stability.

In a preferred further development, the end part of the metallic part has at least one constriction. This renders the mechanical anchoring between the dielectric extension and the metallic rod even more stable and robust. The constriction facilitates clamping which can, in particular, be elastically engaged and released.

In a particularly preferred further development of the above-mentioned embodiment, the end part of the metallic rod has the approximate shape of an elongated ellipsoid of revolution. This shape produces minimum field peaks, in particular, due to the smooth and constant reduction in size of the outer diameter of the metallic rod, and therefore yields the best dielectric strengths.

In one further particularly advantageous development, the rod of dielectric material is sealingly connected to the overall surface of the end part, in particular, without air inclusions. In other words, the end part and the rod of dielectric material are in contact over their entire surface. This again improves the dielectric strength at the connecting surface.

In one further advantageous embodiment of the inventive tubular capacitor, the dielectric material of the cylindrical tube and the dielectric material of the rod have relative dielectric constants of between 1.3 and 5, the dielectric material preferably being Teflon in both cases. This material is suitable to prevent high voltage sparkovers.

In another preferred embodiment, the relative dielectric constants of the dielectric material of the cylindrical tube and the rod differ by 1.0 or less, with the two relative dielectric constants preferably being equal. This also reduces the tendency for high voltage sparkovers.

The invention also concerns a nuclear magnetic resonance (NMR) probe head, comprising a radio frequency (RF) resonator and a circuit for operating the RF resonator, characterized in that the circuit comprises at least one inventive tubular capacitor. A probe head of this type has an improved dielectric strength, such that very short, strong RF pulses can be irradiated into the sample using the RF resonator, and the associated NMR spectrometer measures spectra with improved quality.

Further advantages of the invention can be extracted from the description and the drawing. The features mentioned above and below may be used individually or collectively in arbitrary combination. The embodiments shown and described are not to be understood as exhaustive enumeration but have exemplary character for describing the invention.

The invention is shown and described in more detail in the drawing.

BRIEF DESCRIPTION OF THE DRAWING

FIG. 6b shows an enlarged section of FIG. 6 in the region of the end of the metallic rod, wherein the metallic rod is slightly displaced compared to the position of FIG. 6a;

DESCRIPTION OF THE PREFERRED EMBODIMENT

Current NMR spectrometers almost exclusively use short RF pulses or precisely defined groups of RF pulses to excite the magnetic spins in the measuring sample. The resulting signal is called FID (Free Induction Decay) from which the desired NMR spectrum is subsequently calculated using fast Fourier transformation.

The measuring sample is excited using an RF resonator (RF=radio frequency) which is located within the NMR probe head, closely disposed about the measuring sample and tuned to the desired excitation frequency $f_0$. The proton excitation frequency of today's NMR spectrometers is between 100 MHz and 900 MHz.

Figure 1:
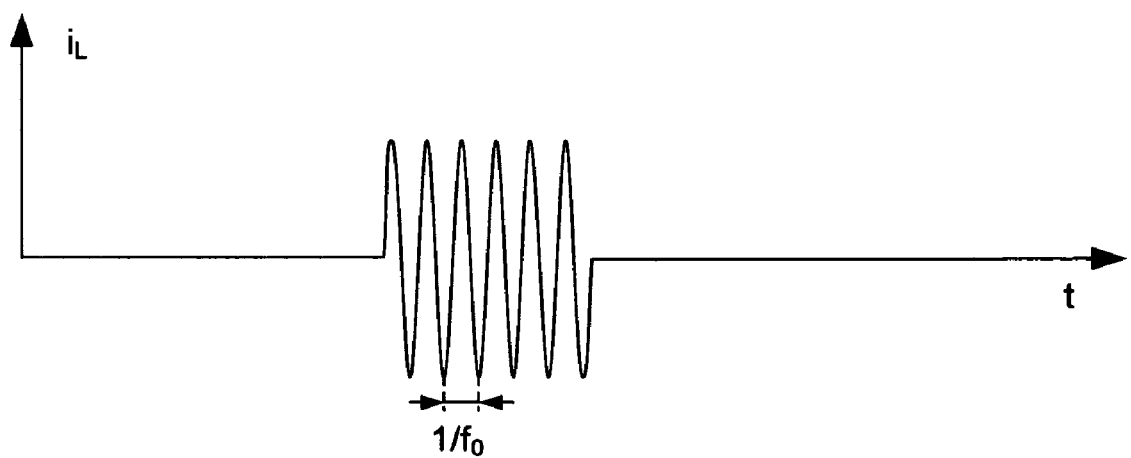
FIG. 1 shows a diagram of the time dependence (t) of a current ($i_L$) in an RF resonator during an RF pulse.

Short RF current pulses $i_L$ are fed into the RF resonator during the excitation process (FIG. 1). This produces short magnetic RF field pulses which excite the spin system.

The RF field pulses must be as short as possible in order to excite the overall NMR spectrum simultaneously and as uniformly as possible, and also have a sufficiently high RF field amplitude such that the axis of rotation of the spin is preferably rotated by a flip angle of approximately 90°. 90° generally guarantees optimum sensitivity, i.e. the best signal-to-noise-ratio (SINO) for the received NMR signal.

The minimum length of the RF field pulses depends on the value of the RF field amplitude that can be set without producing high voltage sparkovers in the RF resonator or in its capacitive tuning elements. RF powers of up to 1 kW are currently fed into RF resonators of NMR spectrometers.

The sparkovers are not necessarily generated in the RF resonator itself but often in the capacitive tuning elements. For this reason, NMR spectrometer manufacturers strive to optimize the high voltage resistance of these capacitive tuning elements.

The RF pulses for exciting the spin system are supplied from an RF transmitter to the RF resonator via an RF line which preferably has an impedance of 50Ω.

Figure 2A:
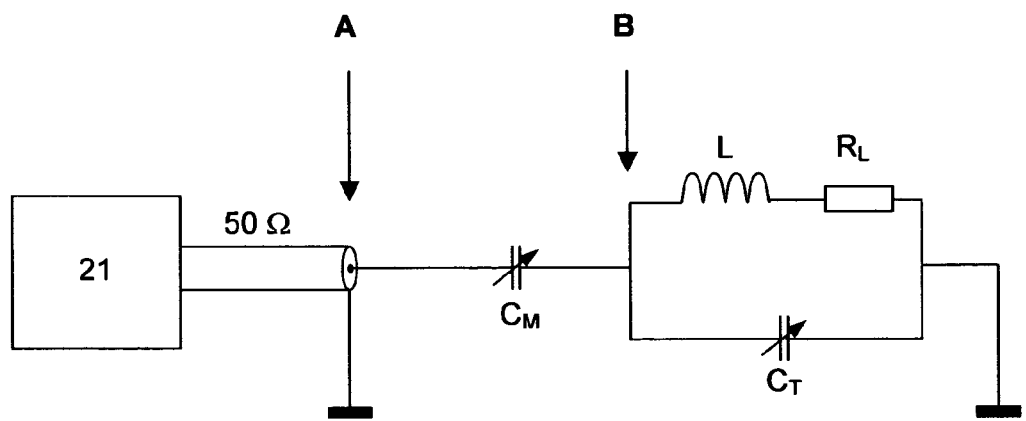
FIG. 2a shows a diagram circuit of a typical RF resonator of a probe head for an NMR spectrometer; the tunable capacitances $C_T$ and $C_M$ may be inventive tubular capacitors.

FIG. 2a shows a typical circuit of an RF resonator as it is often used in NMR. The RF transmitter 21 thereby generates an internal sinusoidal source voltage $U_0$ of a frequency $f_0$, in the present example 600 MHz, which is supplied to the outside via a series resistor of 50Ω. This is called the output resistance of the transmitter which must be identical to the impedance of the RF cable in order to permit reflection-free transmission of energy.

The RF resonator is connected at point A (see FIG. 2a) and consists of an oscillating circuit of L, $C_T$, $C_M$ and $R_L$, wherein $R_L$ is the loss resistance of the NMR coil. $C_M$ matches to 50Ω and $C_T$ tunes the circuit to the correct resonance frequency, wherein both capacitances influence each other during tuning. After tuning, the RF resonator behaves like a 50Ω resistance viewed from point A towards the RF resonator, such that the overall RF energy reaches the RF resonator without being reflected (i.e. 100%). The received power is released in the coil loss resistance $R_L$, i.e. the NMR coil is heated, thereby generating a strong RF field to excite the nuclear spins.

If a solvent (measuring sample) to be investigated is introduced into the coil interior, additional energy can be absorbed therein. The resonance circuit may have to be specifically tuned to its working frequency after introduction of the solvent, since it changes and loads the electric circuit.

Figure 2B:
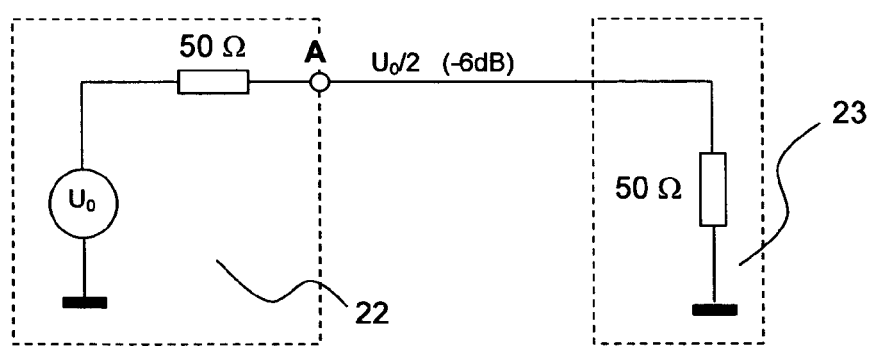
FIG. 2b shows an equivalent circuit diagram of the circuit of FIG. 2a in the tuned state.
Figure 3A:
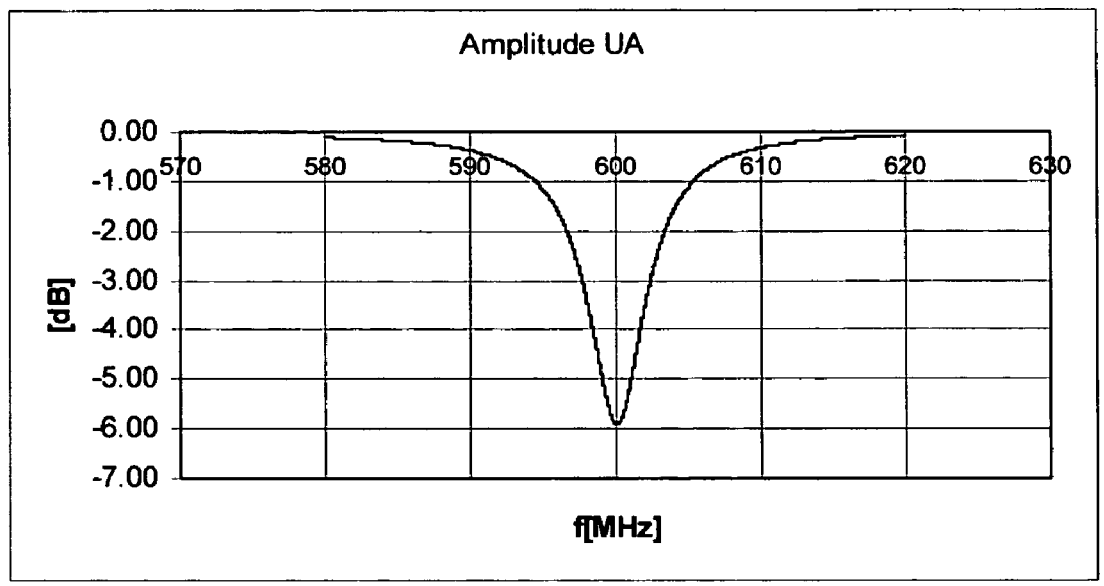
FIG. 3a shows a diagram of the relative amplitude of the voltage U at the point A of the circuit of FIG. 2a as a function of the transmitting frequency f.
Figure 3B:
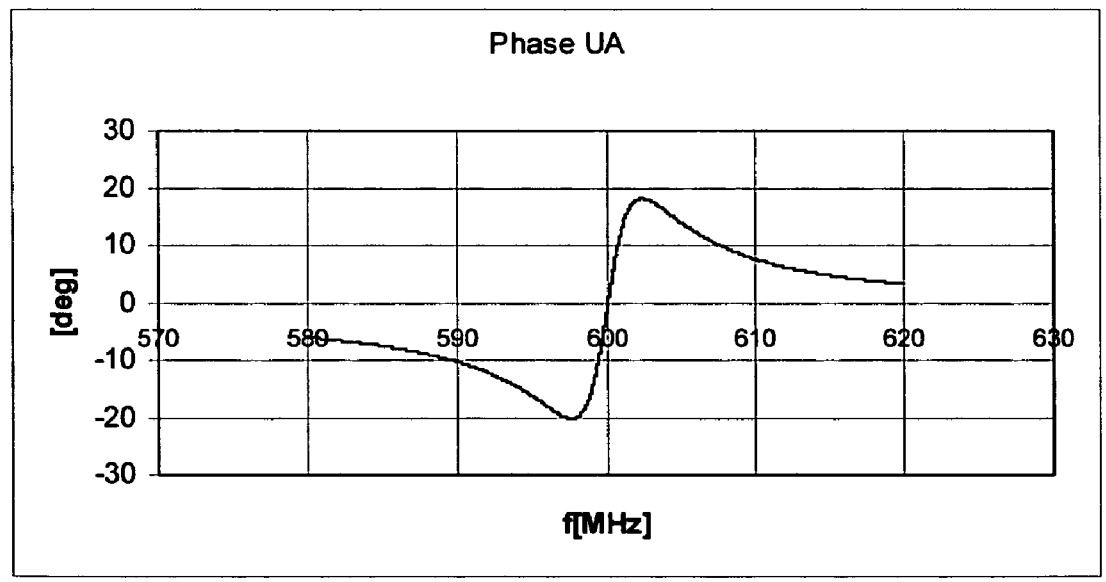
FIG. 3b shows a diagram of the relative phase of the voltage U at the point A of the circuit of FIG. 2a as a function of the transmitting frequency f.

For reasons of simplicity, we consider an RF resonator which is run without measuring sample and is tuned to 600 MHz without reflection. It is correctly tuned when the overall resonator behaves like a 50Ω resistance, i.e. at point A of the circuit, half of the source voltage ($U_0$/2) of the transmitter is measured or the voltage there is minus 6 dB (FIG. 3a) and the phase position is 0° (FIG. 3b). The resonator therefore appears as 50Ω series resistance to the output resistance of the transmitter. FIG. 2b shows the equivalent circuit diagram of the transmitter 22 with the tuned RF resonator 23. If it is not tuned, this equivalent circuit diagram is not valid.

The voltage across the NMR coil at point B (FIG. 2a) may assume very high values depending on the Q-value of the NMR coil. The circuit of FIG. 2a was used in the following example with:

$C_M$=0.172 pF
$C_T$=0.833 pF
L=70 nH
$R_L$=1.5Ω

With a transmitter output power of 300W this yields:
P=$U_A^2$/R R=50Ω i.e. at point A, the voltage is $U_A$=√(P*R)=122 V and the source voltage $U_0$ of the transmitter is therefore 2*$U_A$=245 V. For this reason, the voltage across the NMR sample at point B (FIG. 2a) becomes very large, i.e.

Figure 3C:
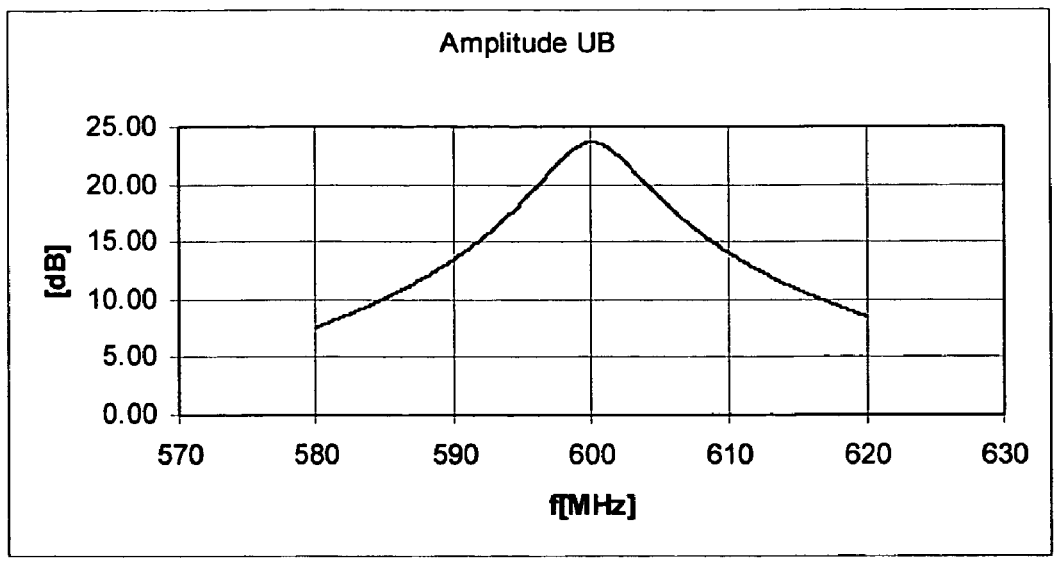
FIG. 3c shows a diagram of the relative amplitude of the voltage U at the point B of the circuit of FIG. 2a as a function of the transmitting frequency f.
Figure 3D:
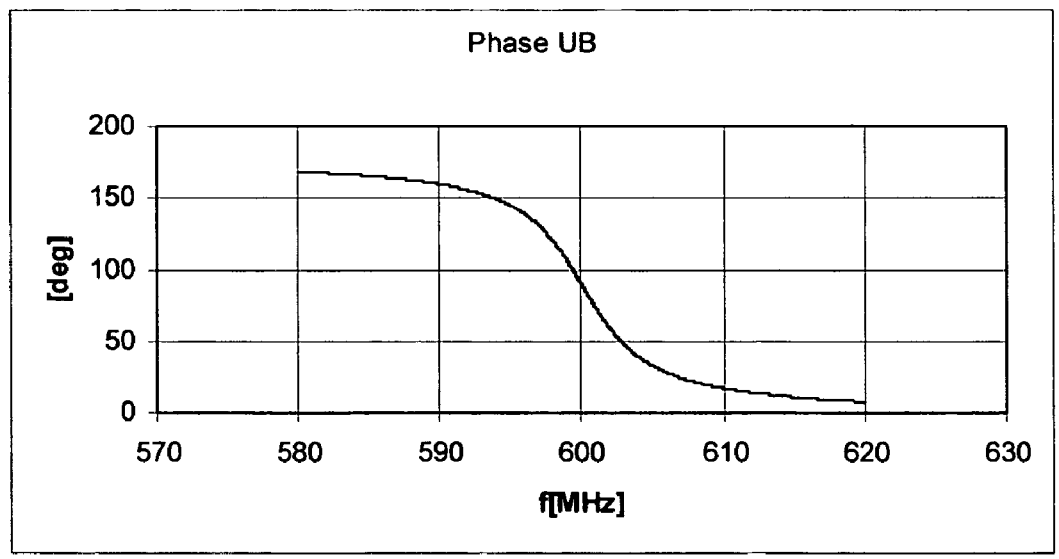
FIG. 3d shows a diagram of the relative phase of the voltage U at the point B of the circuit of FIG. 2a as a function of the transmitting frequency f.

$U_B$=24 dB*$U_0$≈16*$U_0$=3.9 kV$_{eff}$ or $\hat{U}_B$=5.5 kV (peak value)

in accordance with the calculated voltage and phase curves of FIGS. 3c and 3d. This shows that very high RF voltages can occur in the RF resonator.

It must also be taken into consideration that not only high voltages are generated in the coil circuit but also very high currents which finally produce a strong magnetic field to excite the nuclear spins.

The exemplary circuit shown in the drawing may also be understood as a transformer which transforms the loss resistance $R_L$ up to 50Ω, i.e. the transmitter experiences a load of 50Ω but the energy actually enters a resistance which is much smaller.

In general, variable tubular capacitors are used for tuning the resonance and matching the power of the RF resonator. They must have minimum size and negligible magnetic susceptibility values and nevertheless withstand very high RF voltages. In commercial terms, this is a niche product of very high quality which cannot be produced in large quantities and is therefore not interesting for commercial producers of variable capacitances. Producers of NMR spectrometers must therefore design and produce these tubular capacitors themselves.

Figure 4:
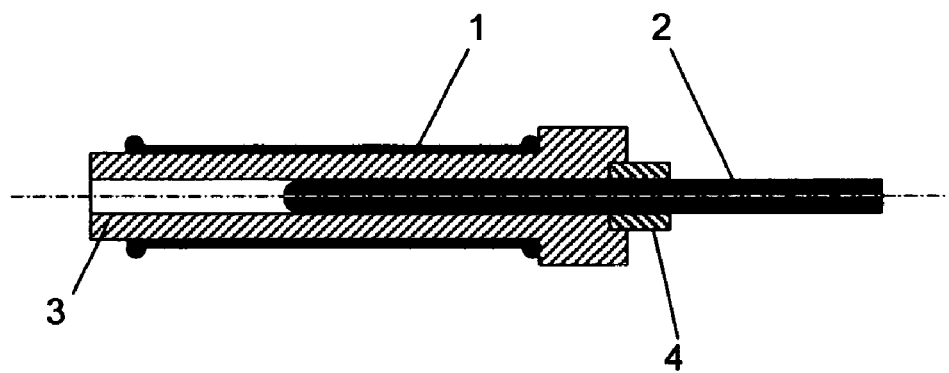
FIG. 4 shows a schematic view of a tubular capacitor with variable capacitance according to prior art.

Tubular capacitors are designed coaxially and cylindrically (FIG. 4) and consist of a cylindrical tube 3 of dielectric material, a metal tube which is externally in fixed abutment as outer electrode 1 and an inner electrode which tightly abuts the inner bore 41 of the cylindrical tube 3 of dielectric material but is axially movable. The latter consists of a metallic rod 2 whose end 5' located in the inner bore 41 is rounded to prevent sharp transitions.

The inner electrode or the metallic tube 2 is contacted e.g. via a metallic contact sleeve 4. Teflon is preferably used for the dielectric tube 3, which is characterized by a high voltage resistance and RF Q. The adjustable capacity range is usually between 0.2 and 6 pF.

When the tubular capacitor $C_T$ or $C_M$ (FIG. 2a) is directly connected to the "hot" RF end of the coil L, the high voltage values calculated above occur directly across the tubular capacitor and it must therefore be designed to withstand these high voltages.

The tubular capacitor $C_M$ may not be directly connected to the hot end of the coil L, but via a fixed series capacitor, in order to reduce the tuning region of the resonance frequency $f_0$ and to permit fine tuning. In this case, the voltage across the tubular capacitor is reduced according to the capacitive voltage divider, and the problems of high voltage resistance are transferred to a larger degree to the additional series capacitor which is, however, less critical, since it has a fixed capacitance value. This is not always the case, but preferably in proton spectroscopy.

The voltage resistance of a capacitor depends firstly on the separation between the electrodes, secondly on the shape of the electrodes and partially of the dielectric, and thirdly on the dielectric strength of the dielectric, wherein the latter may be air, gas, solid or liquid.

Figure 5:
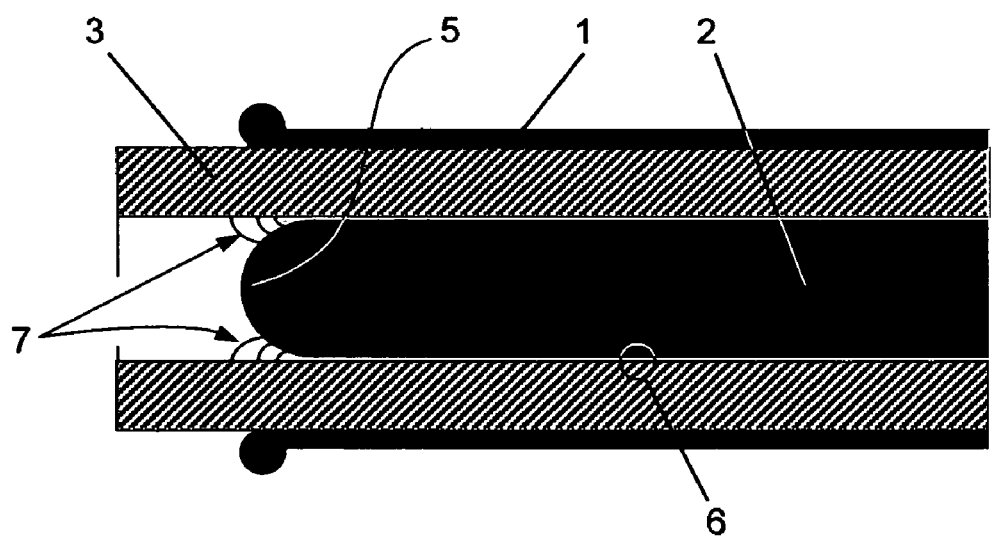
FIG. 5 shows an enlarged section of FIG. 4 in the region of the end of the metallic rod, wherein the metallic rod is displaced compared to the position of FIG. 4.

Within the scope of the invention, it has turned out that the above-described tubular capacitor normally does not break down in the cylindrical region of the metallic rod 2 (e.g. location 6 in FIG. 5) where the air gap is the smallest and a breakdown would be most likely expected. In contrast thereto, the breakdown occurs in a region 7 about the rod end 5', where the air gaps are the largest. This is also the case when the end is round without any sharp transitions, such that no additional increase in the electric field strength is to be expected. This unexpected behavior is explained below.

For this reason, tubular capacitors with improved RF dielectric strengths are urgently needed.

The breakdown in the region 7 (FIG. 5) is produced through local ionisation of the air, thereby producing an electrically conducting plasma which may transmit high peak currents to thereby damage the surface of the inner electrode and also the surface of the inner bore 41 of the dielectric tube 3 in the region of the rod end 5'.

Experimental investigations have shown that changes to the round shape of the metallic rod 2 have no great influence on the dielectric strength if the radii of these round shapes are sufficiently large so that they do not have any sharp transitions. The shape of the outer electrode 1 and the selection of the dielectric and the electrode material only have a secondary influence on the dielectric strength.

Figure 10:
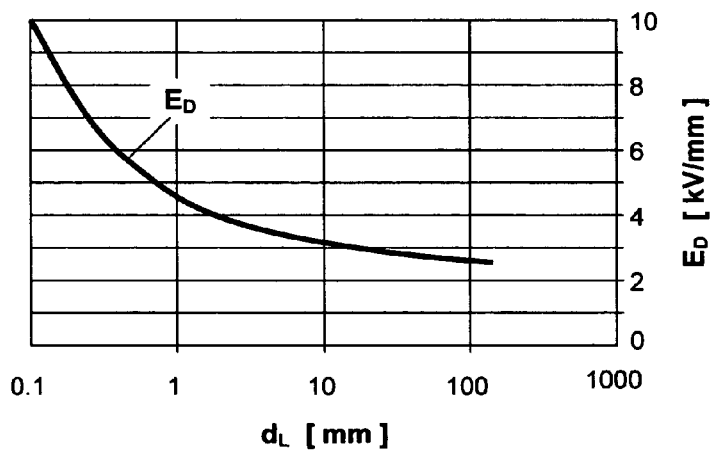
FIG. 10 shows a diagram of the breakdown electric field strength $E_D$ in the air gap between two planar electrodes, plotted against the width $d_L$ of the air gap.

Voltage experiments have also shown that breakdowns usually occur in the air, in the region 7 close to the rod end 5', and not in the solid dielectric. The curve of the breakdown electric field strength $E_D$ for air in dependence on the air gap between two flat electrodes gives the explanation therefor (FIG. 10). It shows that the breakdown electric field strength $E_D$ increases with decreasing air gap, i.e. becomes less critical.

The air regions between the two electrodes of the tubular capacitor having high electric field strengths E and at the same time larger free path lengths $s_L$ along the E lines are critical and susceptible to sparkovers. This is the case with the rounded end 5' of the inner electrode and therefore explains the voltage sparkovers that occur at that location (region 7, FIG. 5).

However, in the cylindrical region of the inner electrode (e.g. region 6, FIG. 5) the air gap is very small (e.g. <0.1 mm) and, since the E lines in the air gap extend perpendicularly to the surface of the metallic rod 2 and the dielectric tube 3, the free path lengths along these E lines are also very small. The voltage resistance in this region is therefore much larger which also explains why no voltage sparkovers occur there.

Since there are different dielectric materials which have a considerably higher dielectric strength than air, it is the underlying purpose of the present invention to reduce all air gaps in regions with high electric field strength to a minimum by replacing these air gaps with a dielectric material having high dielectric strength. One disadvantage thereby is that the inner electrode must remain mobile to permit variable capacitance values.

In accordance with the invention, this basic idea is realized in that the metallic rod 2, 2a, 2b of the inner electrode is axially extended at its end 5' located in the inner bore 41, in particular, at a so-called end part 5, 5a, 5b, 5c provided at that location, using a dielectric rod 9, 9a, 9b, 9c (see FIGS. 6a, 6b, 7, 8 and 9). The dielectric rod 9, 9a, 9b, 9c is preferably sealed, i.e. without air inclusions, relative to the overall surface of this end part 5, 5a, 5b, 5c. The dielectric rod 9, 9a, 9b, 9d preferably also has the same outer diameter as the metallic rod, both at a region 62 (see FIG. 6b) where it is connected to the metallic rod 2, 2a, 2b, 2c as well as preferably along its entire length.

Moreover, the end part 5, 5a, 5b, 5c may not have any sharp transitions, in particular, where transition to the cylindrical part of the inner electrode starts, and the radii of all roundings thereof should have a maximum size. The end part 5, 5a, 5b, 5c of the metallic rod 2 starts where the end 5' region of the metallic rod 2, located in the bore of the dielectric tube 3, differs from the cylindrical shape (i.e. the diameter is reduced) and extends to the actual end 5' of the metallic rod.

Figure 6A:
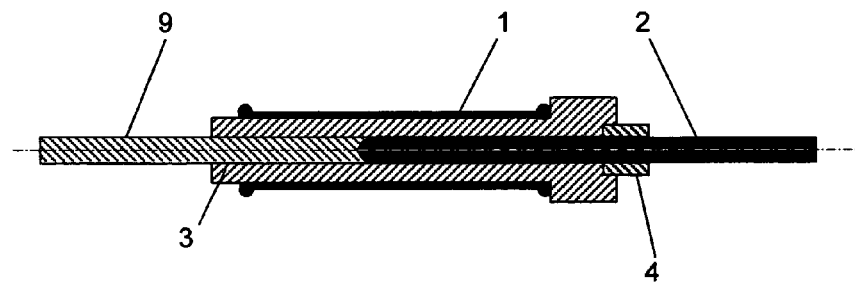
FIG. 6a shows a schematic view of a tubular capacitor with variable capacitance in accordance with the invention.
Figure 6B:
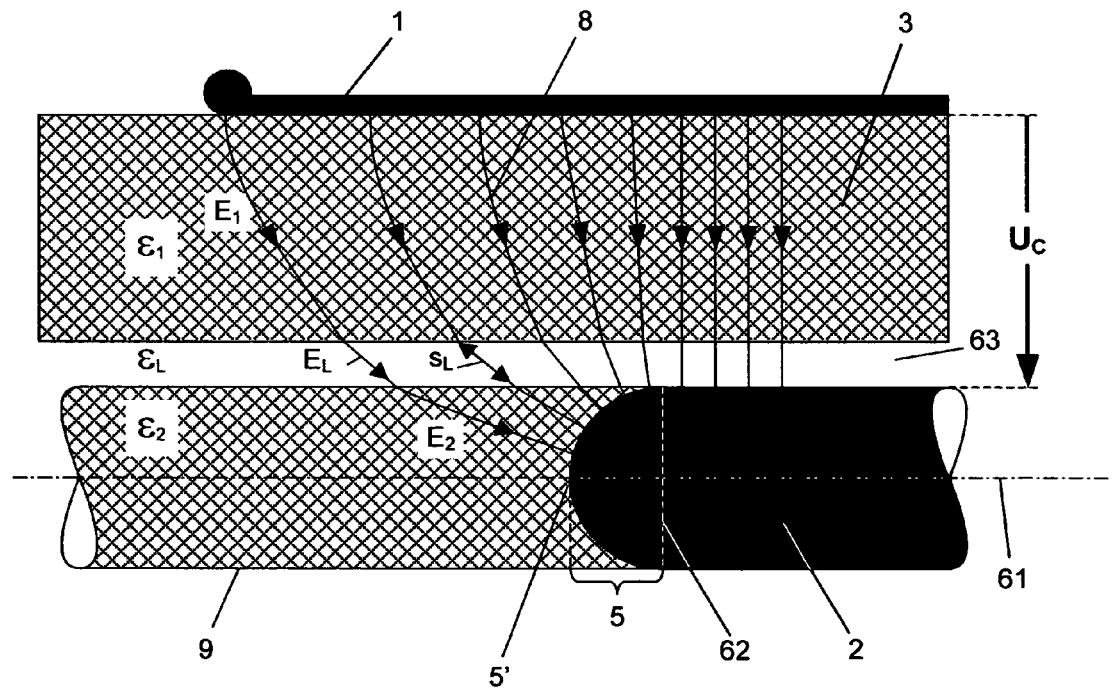

FIG. 6b shows a cross-section of an inventive tubular capacitor with a metallic rod 2 which has a substantially circularly cylindrical shape. The metallic rod 2 has a hemispherical end part 5. A rod 9 of dielectric material, which also has a substantially circularly cylindrical shape, has a hemispherical depression at its end face, in which the end part 5 abuts with its full surface, and is mounted (e.g. glued). The right-hand edge of the dielectric rod 9 (FIG. 6) coincides with the right-hand end (or projection) of the end part 5 in a connecting region 62 which forms an annular line about the inner electrode (comprising the metallic rod 2 and the dielectric rod 9). The metallic rod 2 can be moved to the left and right (FIG. 6b) together with the dielectric rod 9 in order to adjust the capacity of the tubular capacitor.

FIG. 6b shows some electric field lines 8 which form when a voltage $U_C$ is applied between the inner electrode and the outer electrode 1. Field line sections $E_1$ in the dielectric (with dielectric constant $\epsilon_1$) of the tube 3 and field line sections $E_2$ in the dielectric (with dielectric constant $\epsilon_2$) of the dielectric rod 9 are relatively uncritical for the dielectric strength. Field line parts $E_L$ in the air gap 63 (with dielectric constant $\epsilon_L$), however, are critical due to the small dielectric strength of air. Larger free path lengths $s_L$ of the field lines in the air gap 63 produce smaller dielectric strengths. However, the inventive dielectric rod 9 minimizes the free path lengths $s_L$ in the air gap. It should be noted that the field lines further to the left in FIG. 6b have larger free path lengths $s_L$ in the air gap but the electric field strength decreases towards the left, indicated by the larger field line separation. The smaller field strength reduces the danger of a breakdown.

The dielectric rod 9, 9a, 9b, 9c may have any length, but the following should at least be valid $L_D \geq L_A + 1.5 * D_M$, with $L_D$: overall axial extension of the dielectric rod; $L_A$: axial extension of the end part; $D_M$: diameter of the metallic rod, (see for example FIG. 7). In other words: the projecting length $L_{UE}$ of the dielectric rod 9, 9a, 9b, 9c is at least 1.5 times the diameter $D_M$ of the metallic rod. This minimum condition prevents generation of large electric field peaks at the end of the dielectric rod.

Figure 7:
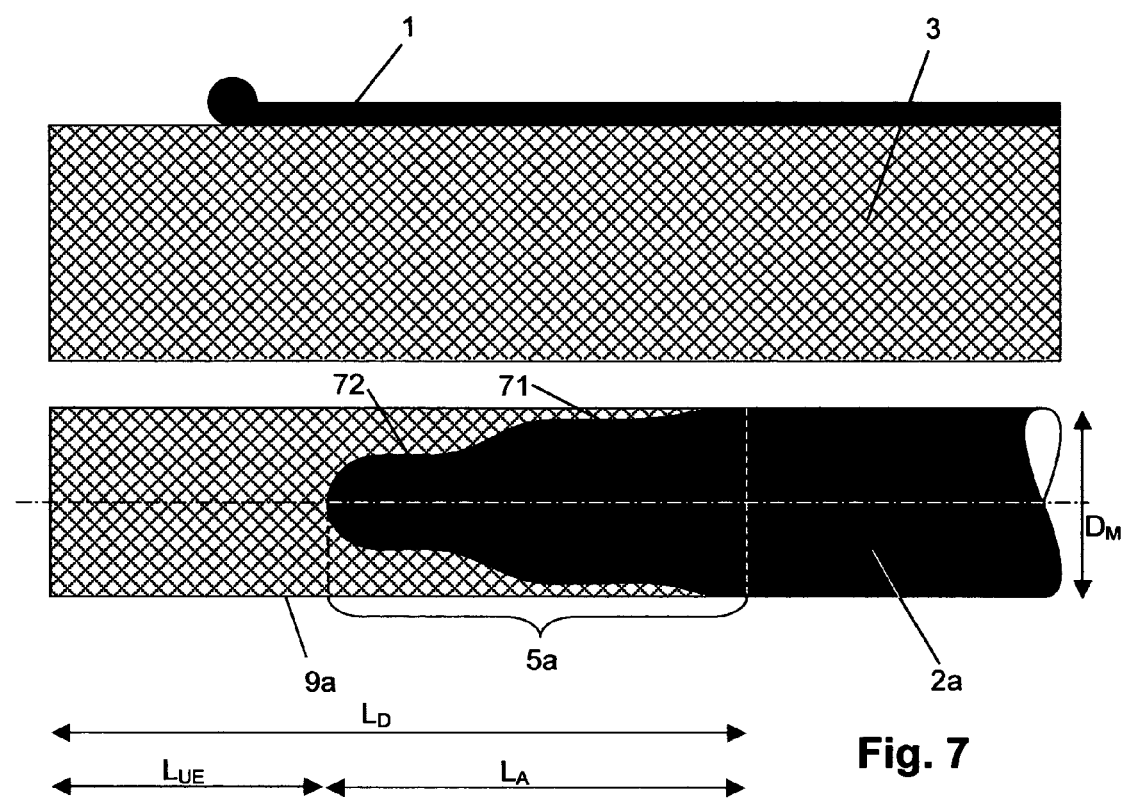
FIG. 7 shows a schematic view of a section of a tubular capacitor with variable capacitance in accordance with the invention with two cylindrical steps in the rounded end part of the metallic rod.

In order to improve the mechanical stability of the connection between the dielectric extension 9a and the metallic rod 2a of the inner electrode, in a preferred embodiment, the shape of the end part 5a can be selected such that it contains at least one cylindrical stage (5a, FIG. 7). In the example of FIG. 7, two cylindrical stages 71, 72 are provided. The smooth reduction of the outer diameter along the end part 5a is also advantageous in that the occurring field peaks are smaller compared to an approximately hemispherical end part (ref. No. 5, FIG. 6b).

Figure 8:
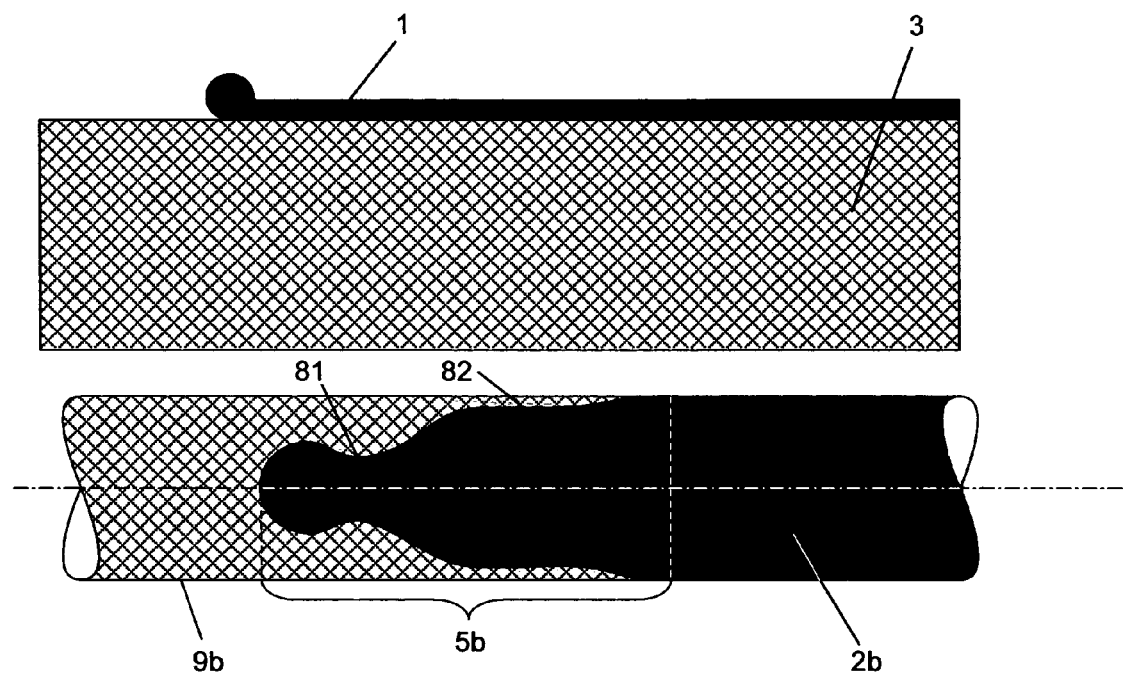
FIG. 8 shows a schematic view of a section of a tubular capacitor with variable capacitance in accordance with the invention comprising a constriction in the rounded end part of the metallic rod.

In a particularly preferred embodiment, the shape of the end part 5b has at least one constriction 81 and preferably also at least one cylindrical step 82 (FIG. 8). The constriction 81 is advantageous in that the mechanical anchoring between the dielectric extension 9b and metallic rod 2b is much more stable and robust.

Figure 9:
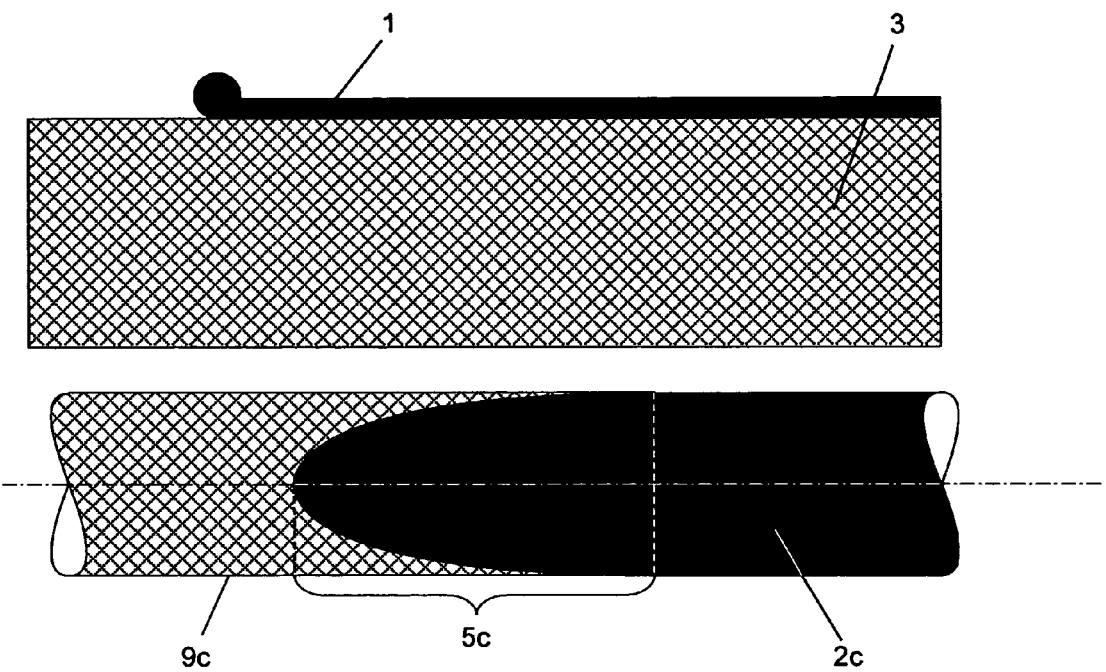
FIG. 9 shows a schematic view of a section of a tubular capacitor with variable capacitance in accordance with the invention with a rounded end part having the shape of an elongated ellipsoid of revolution.

In a further embodiment, the end part 5c has the approximate shape of an elongated ellipsoid of revolution (FIG. 9). These shapes produce minimum field peaks but disadvantageously fail to guarantee reliable and robust anchoring between the dielectric extension and the end part.

The field simulation programs clearly show the behavior of the fields in the air gap between displaceable rod and dielectric.

Two terms will be briefly explained below:

Axial fields or field components are those which extend parallel to the symmetry axis 61 of the tubular capacitor in accordance with FIG. 6b.

Radial fields or field components are perpendicular to the symmetry axis 61 of the tubular capacitor at any point in space.

In the following example, the fields in the air gap were calculated for a metallic rod 2 with an elliptical end part (ellipsoid of revolution 5c in FIG. 9) having a dielectric extension. The dielectric extension 9c of the rod 2c has the same relative dielectric constant as the dielectric of the tube 3, in the present case Teflon, with $\epsilon_r = 2.2$. In this calculation, the excitation was assumed to be a voltage of 1V which is applied to the capacitor. Since the field line images are voltage independent, all field values can be re-scaled for the real case, based on 1V.

Figure 11:
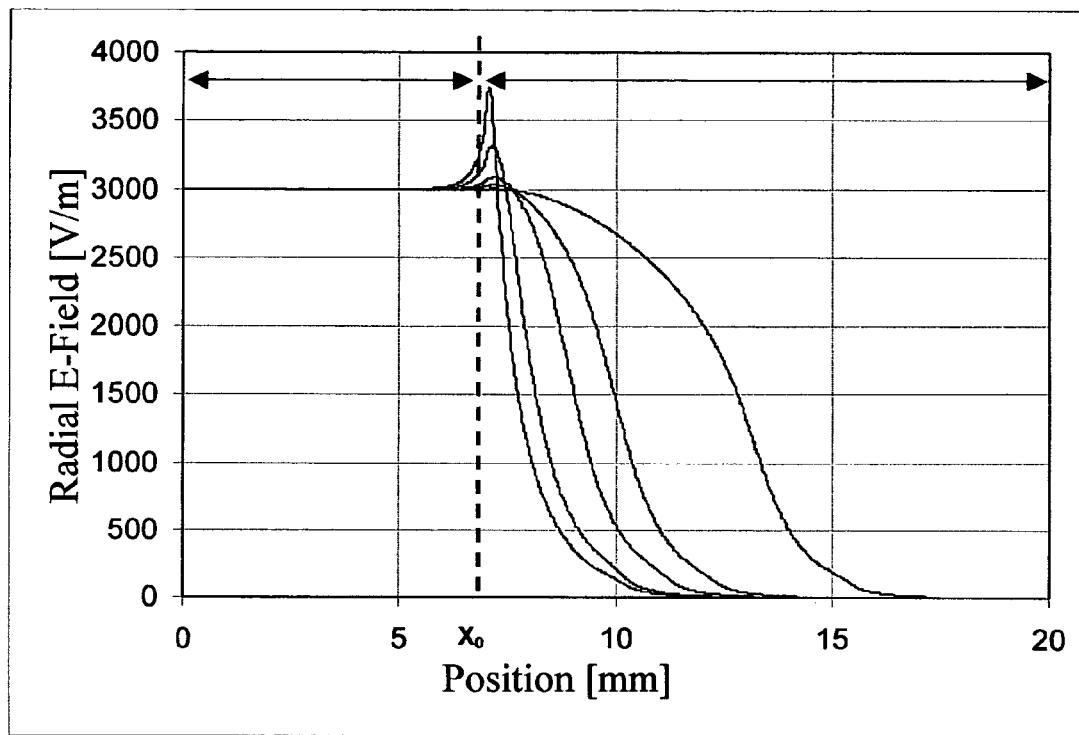
FIG. 11 shows a diagram of the radial electric field in the air gap in the region of the end of the metallic rod in a tubular capacitor according to FIG. 9 with different semiaxis ratios of the ellipsoid of revolution.

FIG. 11 shows the radial field components as a function of position for different respective semiaxis ratios of the ellipsoid of revolution (1:0.5, 1:1, 1:2, 1:3, 1:6 from the left to the right in the right-hand part of the diagram). The origin of the abscissa is somewhere in the cylindrical part of the rod (FIG. 9, 2c) and the radial field components in the air gap between the metallic rod 2 and the dielectric tube 3 are observed beyond the end of the metallic part of the rod. One can see that the field in the cylindrical part of the metallic rod (0<x≧x₀mm; in FIG. 11 the left half of the diagram) has a constant value of 3000 V/m. At location $x_0$, where the metallic part of the rod starts to enter the dielectric extension via an elliptical transition, an excess field in the air gap cannot be prevented. Depending on the geometry of the rod end, this excess can be minimized.

FIG. 11 shows that the long ellipsoid of revolution having an axes ratio of 1:6 has nearly no remaining excess field and the field decreases continuously and smoothly along the air gap (x>x₀mm, right half of diagram). This dielectrically extended rod will be able to withstand very high voltages without forming any sparks at any location. The maximum voltage strength of the tubular capacitor is thereby determined almost exclusively by the voltage strength of the air gap in accordance with FIG. 10.

Figure 12:
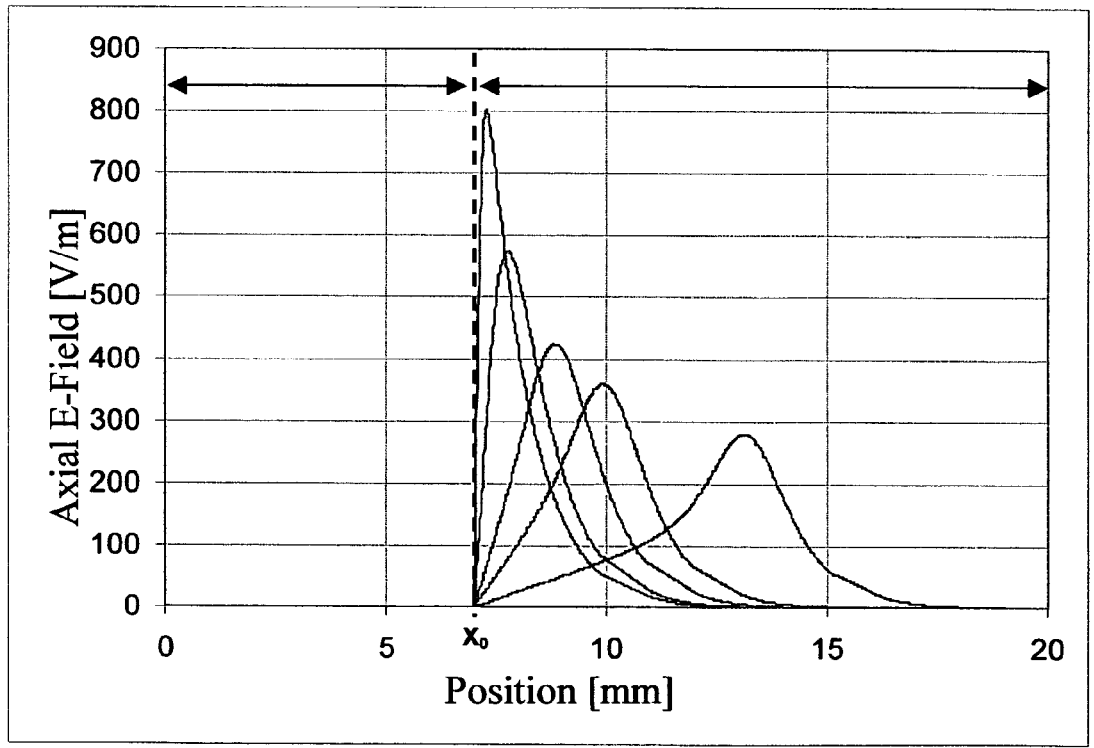
FIG. 12 shows a diagram of the axial electric field in the air gap in the region of the end of the metallic rod in a tubular capacitor corresponding to FIG. 9 with different semiaxis ratios of the ellipsoid of revolution.

FIG. 12 shows the axial field component for the same geometry, and also for different semiaxis ratios of the ellipsoids of revolution (1:0.5, 1:1, 1:2, 1:3, 1:6 from the left to the right relative to the maxima). It is less critical and always considerably smaller than the radial component at any point in the air gap. Nevertheless, it should not be neglected, since it always faces in the direction of the maximum free path length for particle avalanches, i.e. in the direction where breakdown is the easiest and the advantages of the thin air gap in accordance with FIG. 10 are no longer useful.

Practical load measurements on sample structures produced in accordance with the invention confirm the theory: Considerably larger voltages can be applied to the dielectrically extended tubular capacitors without forming sparks and thereby destroying the tubular capacitor.

List of Reference Numerals 1 outer electrode
2,2a,2b,2c metallic rod
3 tube of dielectric material
4 metallic contact sleeve
5,5a,5b,5c end part of the metallic rod
5' end of the metallic rod which is located within the inner bore of the tube 3
6 point in the air gap between dielectric tube 3 and metallic rod 2 in the cylindrical region of the metallic rod 2
7 region of an air gap in the region of the end 5' of the metallic rod
8 field line
9,9a,9b,9c rod of dielectric material
41 inner bore of the tube 3 of dielectric material
61 symmetry axis of the tubular capacitor
62 connecting region
63 air gap
71,72 cylindrical step
81 constriction
82 cylindrical step

We claim:

1. A tubular capacitor with variable capacitance, comprising:
   a cylindrical tube of dielectric material;
   a metallic outer electrode which surrounds said cylindrical tube; and
   an inner electrode which axially moves in an inner bore of said cylindrical tube and which abuts said inner bore, said inner electrode having a metallic rod and a rod of dielectric material which axially extends said metallic rod at an end thereof located in said inner bore of said cylindrical tube, wherein said rod of dielectric material has a same outer diameter as said metallic rod in a region where it is connected to said metallic rod.

2. The tubular capacitor of claim 1, wherein said rod of dielectric material has a same outer diameter as said metallic rod in a longitudinal region immediately joining said metallic rod or along an entire length thereof.

3. The tubular capacitor of claim 1, wherein said dielectric material of said cylindrical tube and said dielectric material of said rod have relative dielectric constants of between 1.3 and 5.

4. The tubular capacitor of claim 3, wherein said tube dielectric material and said rod dielectric material are both polytetrafluoroethylene.

5. The tubular capacitor of claim 1, wherein relative dielectric constants of said dielectric material of said cylindrical tube and said rod differ by 1.0 or less or are equal.

6. A nuclear magnetic resonance (NMR) probe head, comprising a radio frequency (RF) resonator and a circuit for operating the RF resonator, said circuit comprising at least one tubular capacitor of claim 1.

7. A tubular capacitor with variable capacitance, comprising:
   a cylindrical tube of dielectric material;
   a metallic outer electrode which surrounds said cylindrical tube; and
   an inner electrode which axially moves in an inner bore of said cylindrical tube and which abuts said inner bore, said inner electrode having a metallic rod and a rod of dielectric material which axially extends said metallic rod at an end thereof located in said inner bore of said cylindrical tube, wherein said metallic rod has a rounded end part at an end thereof located in said inner bore of said cylindrical tube.

8. The tubular capacitor of claim 7, wherein said end of said metallic rod has no sharp transitions.

9. The tubular capacitor of claim 7, wherein a length $L_D$ of said rod of dielectric material is at least as large as a sum of an axial extension $L_A$ of said end part and 1.5 times a diameter $D_M$ of said metallic rod.

10. The tubular capacitor of claim 7, wherein said end part of said metallic rod has at least one cylindrical step.

11. The tubular capacitor of claim 7, wherein said end part of said metallic rod has at least one constriction.

12. The tubular capacitor of claim 7, wherein said end part of said metallic rod approximately has a shape of an elongated ellipsoid of revolution.

13. The tubular capacitor of claim 7, wherein said rod of dielectric material is connected to an overall surface of said end part in a sealing manner or without air inclusions.

* * * * *